(12) United States Patent
Hoss

(10) Patent No.: US 6,958,914 B2
(45) Date of Patent: Oct. 25, 2005

(54) INTERLOCKING HEAT SINK

(75) Inventor: Shawn P. Hoss, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 10/731,460

(22) Filed: Dec. 9, 2003

(65) Prior Publication Data

US 2005/0122687 A1 Jun. 9, 2005

(51) Int. Cl.$^7$ ................................................ H05K 7/20
(52) U.S. Cl. ...................... 361/704; 361/690; 361/709; 257/706; 174/16.3; 165/80.3; 165/185
(58) Field of Search ................................ 361/690, 697, 361/703, 704, 707, 709; 257/722–724; 174/16.3; 165/80.3, 185

(56) References Cited

U.S. PATENT DOCUMENTS

| 4,890,668 A | | 1/1990 | Cima | 165/104.25 |
|---|---|---|---|---|
| 4,903,761 A | | 2/1990 | Cima | 165/104.25 |
| 5,582,240 A | * | 12/1996 | Widmayer | 165/80.3 |
| 5,592,363 A | * | 1/1997 | Atarashi et al. | 361/689 |
| 5,604,665 A | * | 2/1997 | Chrysler et al. | 361/703 |
| 5,705,854 A | * | 1/1998 | Atarashi et al. | 257/721 |
| 5,818,694 A | * | 10/1998 | Daikoku et al. | 361/703 |
| 6,094,345 A | | 7/2000 | Diemunsch | 361/695 |
| 6,532,141 B1 | * | 3/2003 | Wu | 165/80.3 |
| 6,625,025 B1 | * | 9/2003 | Duxbury et al. | 361/704 |
| 6,735,082 B2 | * | 5/2004 | Self | 361/703 |

FOREIGN PATENT DOCUMENTS

JP     2003051571 A  *  2/2003  ........... H01L/23/36

* cited by examiner

Primary Examiner—Boris Chérvinsky
(74) Attorney, Agent, or Firm—Baker Botts L.L.P.

(57) ABSTRACT

An interlocking heat sink is shaped such that it geometrically mates with an adjacent heat sink such that a linear gap for air flow is not formed between adjacent heat sinks. In multiple processor systems, an interlocking heat sink is associated with each processor.

22 Claims, 2 Drawing Sheets

INTERLOCKING HEAT SINK

TECHNICAL FIELD

The present disclosure relates generally to the field of computer or information systems, and, more particularly, to an interlocking heat sink.

BACKGROUND

As the value and use of information continues to increase, individuals and businesses continually seek additional ways to process and store information. One option available to users of information is an information handling system. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems, including computer systems, typically include at least one microprocessor, memory, and various input and output devices. The power consumed by a microprocessor typically generates heat in the interior of the computer system. As computer systems grow in speed and shrink in size, issues of heat dissipation and component spacing in the interior of the computer system become more important. The heat generated by a microprocessor is especially problematic in multiple processor systems, including many server systems, in which multiple processors are located on a single motherboard. Because most microprocessors do not have a physical structure to remove the heat generated by the microprocessor, many computer systems include a heat sink that is placed near the microprocessor to dissipate the heat generated by the microprocessor. Heat sinks are used to draw heat away from the microprocessor and the motherboard.

In multiple processor computer systems, a single heat sink is used with each processor in the computer. In this manner, as a computer system is designed and manufactured to include one, two, or multiple processors, a heat sink is included with each processor in the computer systems. In many configurations, the heat sink is placed on the surface of the microprocessor package and physically rests on the microprocessor. Because of the physical configuration and layout of many computer systems, the processors of the computer system are often aligned or placed along a row on the motherboard of the computer system. In this configuration, a single, modular heat sink is associated with each processor, and a modular heat sink is included with each processor of the computer system. In this configuration, in a multiple processor computer system, when a modular heat sink is placed on each processor, a small gap, typically having a minimal clearance of 1" or more, will often exist between each of the modular heat sinks. The gap between adjacent heat sinks provides a mounting clearance between adjacent heat sinks and the structure of the chassis. The gap is intended to prevent mounting interference between adjacent heat sinks and the chassis that may otherwise exist due to manufacturing process tolerances. Any mounting interference between adjacent heat sinks or the chassis could have a negative impact on the thermal interface between the heat sink and the heat sink's associated heat source, thereby degrading the heat sink's ability to remove heat or energy from the interior of the computer system.

Many heat sinks include a design that includes a base with a number of parallel fins coupled to the base. In an effort to dissipate ever greater amounts of heat, heat sinks are becoming more dense over time, and the fins of the heat sink are being spaced more closely to one another. In some instances, the geometries of heat sinks are approaching twenty fins per inch. In the case of modular heat sinks aligned along a row, the close spacing of the fins of each heat sink cause some circulated air to bypass the fins of the heat sink and pass through the gap between adjacent heat sinks, as the resistance to air flow is greater through the fins of the heat sink as compared to the gap between the heat sinks. The passage of air through the gap between modular heat sinks prevents the combination of the modular heat sinks from reach their cooling effectiveness, as flowing air passes between the modular heat sinks instead of passing over the fins of each heat sink.

Some designs have attempted to prevent the issue of air bypass through the gap between modular heat sinks by placing a barrier or divider in the gap between adjacent heat sinks. This barrier is typically composed of a plastic or foam material and attempts to prevent flowing air from moving through the gap between adjacent heat sinks. This solution, however, is less than optimal in that any gap between the barrier and the heat sink produces a bypass for flowing air and the placement of a barrier between adjacent heat sinks necessarily reduces the space and surface area of each heat sink over which air can flow into and out of the heat sink.

SUMMARY

In accordance with the present disclosure, interlocking heat sinks are disclosed. The heat sinks of the present disclosure include a geometric form such that a linear gap is not present between adjacent heat sink. In a multiple processor computer system, a single heat sink is associated with each processor. Each heat sink includes an offset portion that geometrically mates with a coordinate portion of an adjacent heat sink. Multiple gaps may be formed by the adjacent heat sinks, none of which are provide a transverse path for air flow between the heat sinks.

A technical advantage of the present disclosure is the prevent of air flow between a gap formed between adjacent heat sinks. The design and arrangement of the heat sinks of the present invention forms a pressure drop across the length of the heat sinks that is relatively uniform. As such, there is not a pressure difference that causes a flow of air through a linear gap between adjacent heat sinks. The offset portions of the geometrically mated heat sinks forecloses the existence of a linear gap for the path of flowing air between adjacent heat sinks.

Another technical advantage of the present disclosure is the use of heat sinks having fins that are arranged horizontally relative and parallel to the base of the heat sink and top surface of the processor package. The horizontal arrangement of the fins of the heat sinks provides for the flow of air through the heat sink regardless of the direction of the source of the air.

Another technical advantage of the present disclosure is the use of heat sinks that are modular in nature. As a result, the heat sink disclosed herein is effective whether the heat sink is used alone, as in the case of a single processor computer system, or with other heat sink in a multiple processor computer system. As multiple processors are added to or designed into a computer system, the modular design of the heat sink described herein allows a heat sink to be added with each additional processor. The heat sinks described herein retains its air flow advantages irrespective of the number of processors included in the computer system. Other technical advantages will be apparent to those of ordinary skill in the art in view of the following specification, claims, and drawings.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a person computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communication with external devices as well as various input and output (I/O) devices, such as a keyboard, a mouse, and a video display. The information handling system may also include one or more buses operable to transmit communications between the various hardware components.

Figure 1:
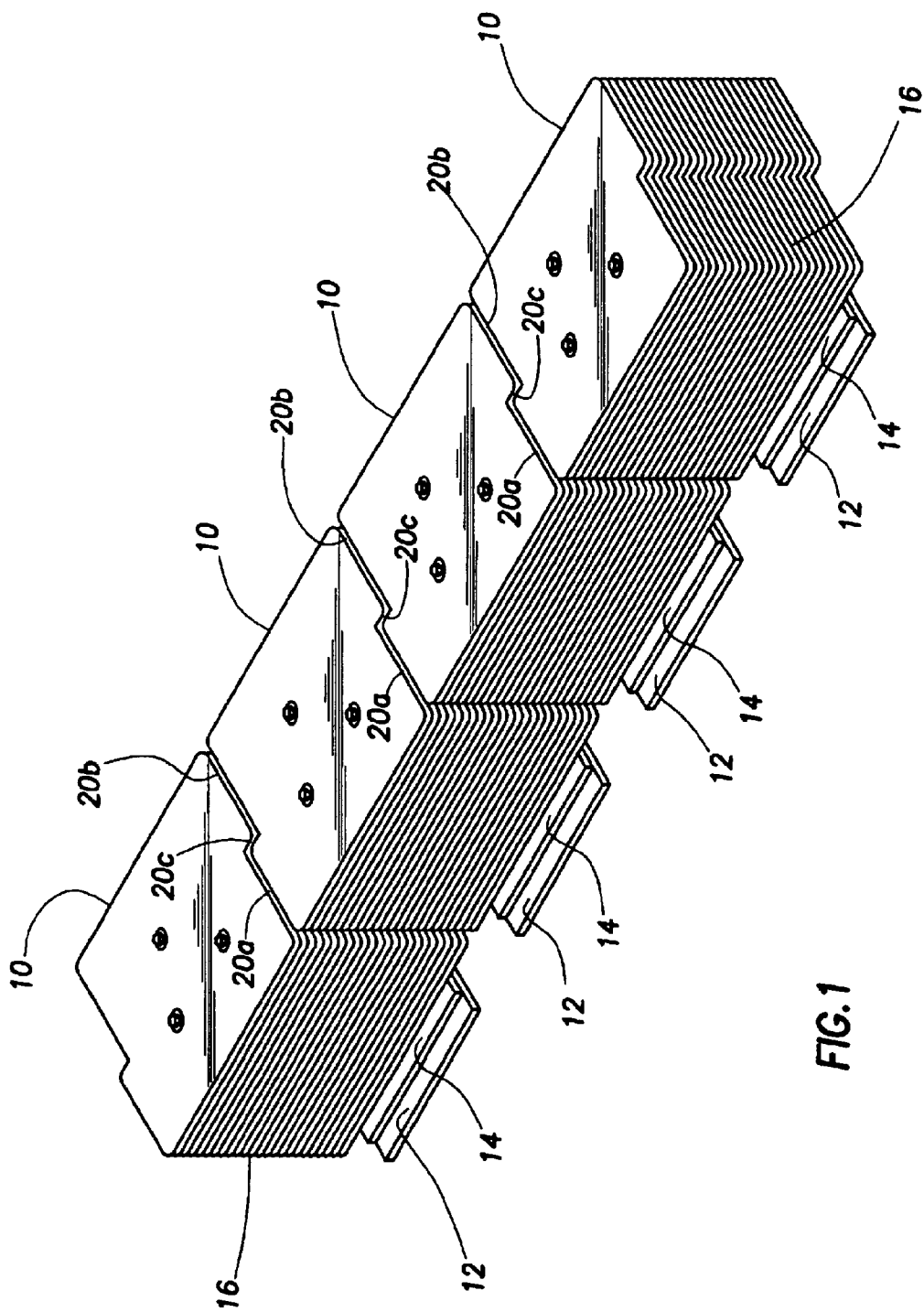
FIG. 1 is a pictorial view of a group of interlocking heat sinks.

FIG. 1 is a pictorial view of four interlocking heat sinks, each of which rests on a single processor. The interlocking heat sinks are identified as heat sinks 10 and the processors are identified as processors 12. Each heat sinks includes a base 14 and a number of fins 16. In the heat sinks of FIG. 1, the fins are positioned horizontally. The horizontal positioning of the fins is defined by the plane of the fins being parallel to the base of the heat sink and the top surface of the processor package. The shape of each heat sink is rectangular and offset, with each heat sink having extended offset portions 18 at its opposite ends. Extended offset portions 18 are sized such that these offset portions allow the heat sinks to geometrically mate and fit together with adjacent heat sinks.

Figure 2:
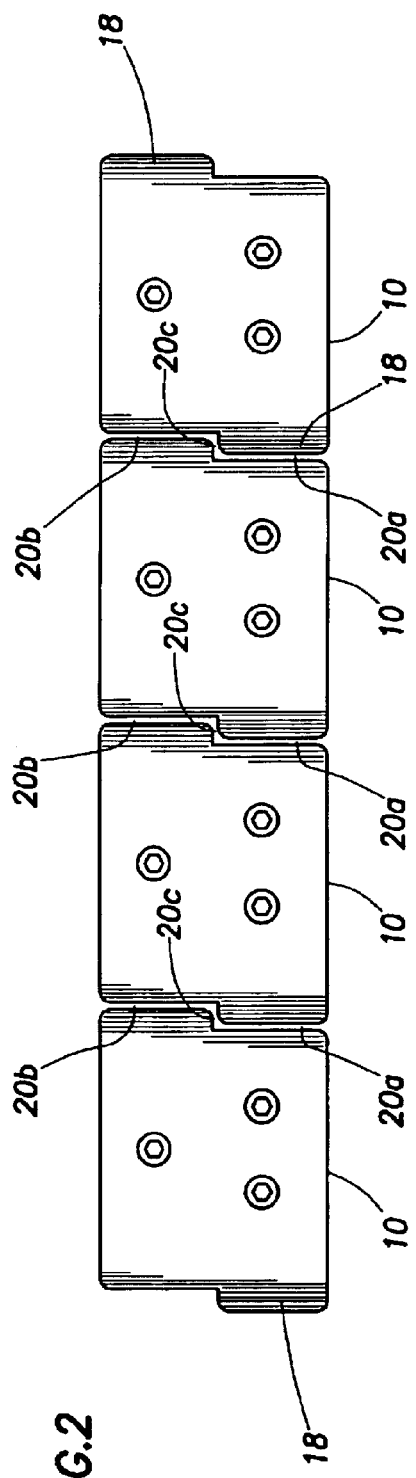
FIG. 2 is a top view of the heat sinks of FIG. 1.

Because of the geometric mating of adjacent heat sinks, the gap between adjacent heat sinks does not allow the unimpeded flow of air between the gap between adjacent heat sinks. Because of the shape and positioning of adjacent heat sinks, two gaps 20a and 20b exist between the heat sinks. These gaps 20a and 20b are offset from each other by a third transverse gap 20c. Because the fins of the heat sinks of FIG. 1 are oriented in a horizontal direction, flowing air passes through the fins of the heat sinks irrespective of the direction of the source of the flowing air. Shown in FIG. 2 is a top view of heat sinks 10 of FIG. 1. As shown in FIG. 2, each sink 10 includes offset portions 18 that permit the spatial mating of adjacent heat sinks. Offset gaps 20a and 20b and a transverse gap 20c are formed between adjacent heat sinks. When viewed from a top view Because of the spatial relationship between adjacent heat sinks, there is not an unimpeded path for air flow between adjacent heat sinks. The absence of an unimpeded path of air flow through the heat sinks results in an almost uniform air pressure drop across the length of the group of heat sinks. The length of the heat sink being defined as the dimension of the heat sink that is generally perpendicular to the gaps between adjacent heat sinks. Due to the uniformity of the air pressure drop, flowing air passes through the fins of the group of heat sinks in a generally uniform manner and is not concentrated for passage through the gap between the heat sinks. Because flowing air moves through the group of heat sinks without the concentration of air flow in a single air path through the group of heat sinks, the dissipation of heat across the group of heat sinks is improved as compared with a grouping of two more heat sinks that include a linear, or straight-line, path for flowing air between the pair of heat sinks.

Figure 3:
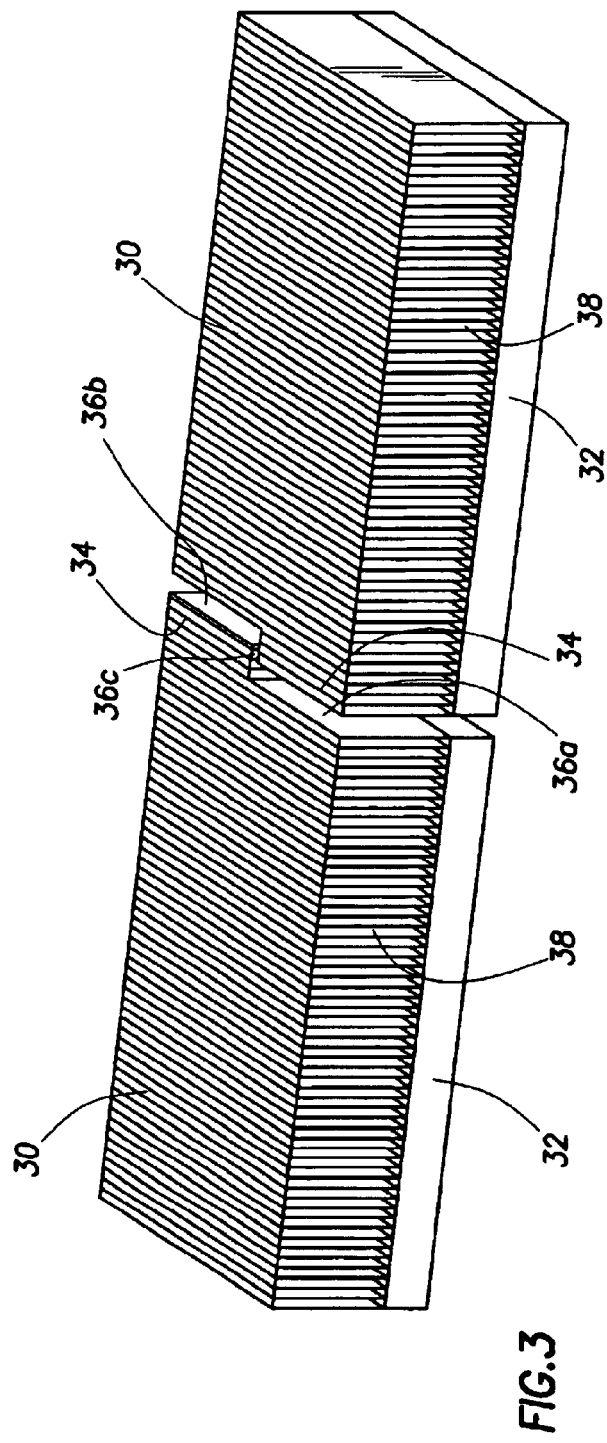
FIG. 3 is a pictorial view of a pair of adjacent heat sinks having vertically oriented fins.

Shown in FIG. 3 is a pictorial view of a pair of adjacent heat sinks 30, each of which rests on a microprocessor package 32. Like the heat sinks 10 of FIGS. 1 and 2, each of the heat sinks includes offset portions 34 at its opposite ends. Because of the offset portions of the heat sinks, the heat sinks mate or fit together with one another in a manner that defines two gaps 36a and 36b that are offset from one another by a transverse gap 36c. The heat sinks are oriented together such that there is not a linear path for air flow between the adjacent heat sinks. The fins 38 of heat sinks 30 are in a vertical orientation. The fins are perpendicular to the top surface of the microprocessor package 32. In the case of fins oriented in the vertical direction, maximum heat dissipation occurs when the flow of air occurs across the length of the fins.

It should be recognized that other spatial relationship between adjacent heat sinks may achieve the objects of the interlocking heat sinks disclosed herein. The adjacent heat sinks need not interlock with one another according to a rectilinear geometry. Rather, adjacent fins may interlock with geometries that are not rectilinear, including circular or triangular geometries. In accordance with the teachings of the present invention, adjacent heat sinks may interlock in any manner such that a direct path of unimpeded air flow does not exist and the pressure drop across the length of the group of heat sinks is relatively uniform. Although the present disclosure has been described in detail, it should be understood that various changes, substitutions, and alterations can be made hereto without departing from the spirit and the scope of the invention as defined by the appended claims.

What is claimed is:

1. A computer system, comprising,
a plurality of processors, each of which is associated with a heat sink; and a memory;

wherein the heat sinks associated with the plurality of processors are sized such that a linear path for flowing air is not formed in the gap between adjacent heat sinks, and wherein the heat sinks are shaped such that each heat sink includes an offset portion that is sized to mate with a coordinate portion in an adjacent heat sink.

2. The computer system of claim 1, wherein the heat sinks are shaped and oriented toward one another such that air flowing toward the gap between adjacent heat sinks flows through the fins of the adjacent heat sinks.

3. The computer system of claim 1, wherein the offset portion of each heat sink is rectangular in nature.

4. The computer system of claim 3, wherein each heat sink includes two offset portions positioned on opposite corners of the heat sink.

5. The computer system of claim 4, wherein each heat sink comprises a base and a plurality of fins coupled to the base.

6. The computer system of claim 5, wherein the fins are generally parallel to the base.

7. The computer system of claim 4, wherein adjacent heat sinks form between them two linear gaps that are offset from each other by a transverse distance.

8. A heat sink, comprising:

a base; and a plurality of fins coupled to the base;

wherein the heat sink is sized such that when the heat sink is placed adjacent to a like heat sink, a non-linear air path is present between the adjacent heat sinks; and wherein the heat sink is sized such that the heat sink includes an offset portion that is sized to mate with a coordinate portion in an adjacent heat sinks.

9. The heat sink of claim 8, wherein the offset portion of the heat sink is rectangular in nature.

10. The heat sink of claim 9, wherein the heat sink includes two offset portions positioned on opposite corners of the heat sink.

11. The heat sink of claim 9, wherein the fins of the heat sink are generally parallel to the base of the heat sink.

12. A method for arranging heat sinks in a multiple processor computer system, comprising the step of, for each processor of the computer system, placing a heat sink proximate the processor, wherein each heat sink is sized such that a linear path for air flow is not formed between adjacent heat sinks, and wherein the heat sinks are shaped such that each heat sink includes an offset portion that is sized to mate with a coordinate portion of the adjacent heat sink.

13. The method for arranging heat sinks of a multiple processor system of claim 12, wherein adjacent heat sinks are shaped and oriented toward one another such that air flowing toward the gap between adjacent heat sinks flows through the fins of the adjacent heat sinks.

14. The method for arranging heat sinks of a multiple processor system of claim 12, wherein the offset portion of each heat sink is rectangular in nature.

15. The method for arranging heat sinks of a multiple processor system of claim 14, wherein each heat sink includes two offset portions positioned on opposite corners of the heat sink.

16. The method for arranging heat sinks of a multiple processor system of claim 15, wherein each heat sink comprises a base and a plurality of fins coupled to the base.

17. The method for arranging heat sinks of a multiple processor system of claim 16, wherein the fins are generally parallel to the base.

18. The method for arranging heat sinks of claim 12, wherein the adjacent heat sinks form between them two linear gaps that are offset from each other by a transverse distance.

19. The method for arranging heat sinks of claim 12, wherein each of the heat sinks are shaped such that each heat sink includes two rectangular offset portions at opposite corners of the heat sinks such that the rectangular offset portions each heat sink are sized to mate with the coordinate portion of an adjacent heat sink;

wherein each heat sink is comprised of a base and a number of fins oriented in parallel to the surface of the base; and wherein the adjacent heat sinks form between them two linear gaps that are offset from each other by a transverse distance.

20. A heat sink, comprising:

a base;

a plurality of fins coupled to the base;

wherein the heat sink is sized such that, when the heat sink is placed adjacent to a like heat sink, the adjacent heat sinks form an interlocking pair of heat sinks whose geometries mate with one another; and wherein the heat sink is sized such that, when the heat sink is placed adjacent to a like heat sink, a linear, transverse path for air flow that is perpendicular to the length of the adjacent heat sinks is not formed between the adjacent heat sinks.

21. The heat sink of claim 20, wherein the fins of the heat sink are generally parallel to the base of the heat sink.

22. The heat sink of claim 20, wherein the fins of the heat sink are generally perpendicular to the base of the heat sink.

* * * * *